(12) United States Patent
McCallister

(10) Patent No.: US 7,542,519 B2
(45) Date of Patent: Jun. 2, 2009

(54) RADIO FREQUENCY TRANSMITTER AND METHOD THEREFOR

(75) Inventor: Ronald Duane McCallister, Scottsdale, AZ (US)

(73) Assignee: Crestcom, Inc., Scottsdale, AZ (US)

( * ) Notice: Subject to any disclaimer, the term of this patent is extended or adjusted under 35 U.S.C. 154(b) by 664 days.

(21) Appl. No.: 11/323,686

(22) Filed: Dec. 29, 2005

(65) Prior Publication Data

US 2007/0165743 A1    Jul. 19, 2007

(51) Int. Cl.
H04L 25/03 (2006.01)
H03F 1/26 (2006.01)
H04B 1/04 (2006.01)

(52) U.S. Cl. .................. 375/297; 375/296; 330/149; 455/114.3

(58) Field of Classification Search ......... 375/295–298; 330/149; 332/103, 159–161; 455/114.1–114.3
See application file for complete search history.

(56) References Cited

U.S. PATENT DOCUMENTS

| | | | |
|---|---|---|---|
| 4,878,029 A | 10/1989 | Saulnier et al. | |
| 4,888,557 A | 12/1989 | Puckette, IV et al. | |
| 4,902,979 A | 2/1990 | Puckette, IV | |
| 5,049,832 A | 9/1991 | Cavers | |
| 5,454,007 A | 9/1995 | Dutta | |
| 5,559,807 A | 9/1996 | van den Heuvel et al. | |
| 6,766,157 B1 | 7/2004 | Hunzeker et al. | |
| 6,973,297 B1 | 12/2005 | Manku et al. | |
| 2001/0024475 A1* | 9/2001 | Kumar | 375/270 |
| 2002/0186783 A1* | 12/2002 | Opas et al. | 375/297 |
| 2003/0156658 A1 | 8/2003 | Dartois | |
| 2003/0179831 A1 | 9/2003 | Gupta et al. | |
| 2005/0058220 A1* | 3/2005 | Nagatani et al. | 375/296 |
| 2005/0101269 A1 | 5/2005 | Dale et al. | |
| 2005/0136860 A1 | 6/2005 | Subasic et al. | |
| 2005/0162225 A1* | 7/2005 | Suzuki et al. | 330/149 |
| 2005/0163252 A1 | 7/2005 | McCallister et al. | |

OTHER PUBLICATIONS

Santamaria, Ibanez, Lazaro, Pantaleon, Vielva "Modeling Nonlinear Power Amplifiers in OFDM Systems from Subsampled Data: A Comparative Study Using Real Measurements" Feb. 20, 2003.

(Continued)

*Primary Examiner*—Young T. Tse
(74) *Attorney, Agent, or Firm*—Lowell W. Gresham; Jordan M. Meschkow; Gouri G. Nair

(57) ABSTRACT

An RF transmitter (10) is configured to transmit either wideband multichannel modulations or narrowband multichannel modulations in a variety of licensed frequency bands (70) using a single set of hardware. For narrowband modulations, a digital IF upconversion stage is performed so that, after upconversion to RF, image signals 74 are sufficiently displaced from the licensed frequency band (70) so as to be filtered off. For wideband modulations, no IF modulation stage occurs, and a direct upconversion takes place from baseband to RF. LO leakage is cancelled using a negative feedback loop that combines a digital DC signal with a communication signal (26, 52) prior to a direct or final analog upconversion stage (62).

35 Claims, 5 Drawing Sheets

OTHER PUBLICATIONS

Park, Woo, Raich, Kenney, Zhou "Adaptive Predistortion Linearization of RF Power Amplifiers Using Lookup Tables Generated from Subsampled Data" Georgia Inst. of Tech. 2002.

Ibanez-Diaz, Pantaleon, Santamaria, Fernandez, Martinez "Nonlinearity Estimation in Power Amplifiers Based on Subsampled Temporal Data" IEEE 2001.

Cavers "The Effect of Quadrature Modulator and Demodulator Errors on Adaptive Digital Predistorters for Amplifiers Linearization" IEEE Transactions on Vehicular Tech. 1997.

Plante, Wong "Opening Base Station Architectures Part 1: An Inside Look at OBSAI" Altera Corp., http://www.commsdesign.com/printableArticle/?articleID=50500130, 2003.

Feulner "Direct Up-Conversion Lowers Base-Station Costs" Inst. of Physics, Ltd. Apr./May 2005.

"Aero IIe Transceiver for GSM, GPRS, and EDGE" Silicon Laboratories, 2005.

"Wireless Infrastructure Solutions Guide: Amplifiers, ASIC, Clock Distribution Circuits, Data Converters, Digital Signal Processors, etc" Texas Instruments, 2Q 2005.

* cited by examiner

RADIO FREQUENCY TRANSMITTER AND METHOD THEREFOR

TECHNICAL FIELD OF THE INVENTION

The present invention relates generally to the field of radio-frequency (RF) communications. More specifically, the present invention relates to RF transmitters of a type that may be used in cellular basestations and in other RF applications.

BACKGROUND OF THE INVENTION

Manufacturers almost always feel pressure to lower costs, but in connection with cellular basestations that pressure, along with a desire to reduce weight and volume, is particularly strong. Lower basestation costs allow a basestation manufacturer to more effectively compete, and they also lead to better and/or less expensive cellular telephony services for ultimate consumers. But in connection with cellular basestations, the benefits of lower costs are amplified. Lower basestation costs, along with reduced basestation weight and volume, allow a cellular-service provider to install more basestations in a given area, such as a city. This not only provides better cellular coverage, but it allows the basestations and mobile stations with which they communicate to transmit at lower power levels because distances between the two are usually smaller (e.g., link propagation losses increase approximately as the fourth-power of link distance). The use of lower power levels in mobile stations leads to the use of smaller batteries and correspondingly smaller cell phones. And, the use of lower power leads to smaller cells and greater reuse of a licensed frequency band through which cellular service is being provided. Greater frequency reuse in a given area leads to the conveyance of more communications in the given area using the same spectrum. Thus, lower basestation costs have far reaching consequences beyond the direct economic advantages achieved.

The goal of reducing cellular basestation costs faces many obstacles. One of these obstacles is the diverse number of cellular frequency bands and standards in use worldwide. Moreover, new standards are being repeatedly proposed for the provision of newer and better cellular services in the future. The following table illustrates many of these:

TABLE I

SURVEY OF EXISTING AND PROPOSED CELLULAR SYSTEMS

| Cellular Band | Dnlink (MHz) | Uplink (MHz) |
|---|---|---|
| 450 MHz | 462.5-467.5 | 452-5-457.5 |
| US CELLULAR (AMPS) | 869-894 | 824-849 |
| SMR, iDEN | 851-869 | 806-824 |
| GSM-900 | 935-960 | 890-915 |
| EGSM | 925-960 | 880-915 |
| DCS-1800 (GSM-Europe) | 1805-1880 | 1710-1785 |
| CDMA Korea | 1840-1870 | 1750-1780 |
| 1900 (US PCS) | 1930-1990 | 1850-1910 |
| UMTS/IMT-2000 | 2110-2170 | 1920-1980 |

Each different frequency band and bandwidth imposes somewhat different constraints on the basestation hardware. Regardless of band and bandwidth considerations, different standards call out entirely different modulation techniques that impose still other constraints on the basestation hardware.

The modulation techniques fall into two different families, distinguished from one another by bandwidth. One is the wide bandwidth family, which transmits either a spread-spectrum signal using code division multiple access (CDMA) techniques or an orthogonal frequency-division multiplex (OFDM) signal. The other is the narrow bandwidth family which transmits a narrow bandwidth signal using either binary or 8-ary Gaussian minimum shift keying (GMSK) and similar techniques. The narrow bandwidth family of modulation techniques is a characteristic of Global System for Mobile communications (GSM) systems. For the purposes of the present invention, narrowband (NB) signals and the narrow bandwidth family shall be characterized as using a bandwidth of less than 750 KHz per channel while wideband (WB) signals and the wide bandwidth family shall be characterized as using a bandwidth of greater than 750 KHz. With all these diverse systems and proposed systems, economies of scale are difficult to achieve, and when one system is adopted, flexibility in making future changes, upgrades, and expansion is often sacrificed. This results in severe economic inefficiency that leads to higher basestation costs.

Attempts are ongoing to define basestation standards that will address these economic realities in an attempt to commoditize basestation components, and hopefully lead to lower costs. One such proposal is the Open Base Station Architecture Initiative (OBSAI) and another is the more narrowly focused Common Radio Protocol Initiative (CPRI). These initiatives contemplate the use of a somewhat generic RF module that can accommodate at least two diverse frequency bands and can accommodate multiple adjacent channels that may be placed anywhere in the supported frequency bands. These initiatives reflect a common belief that a single RF module that accommodates a greater number of frequency bands or accommodates more than one family of modulation techniques will be economically inefficient or otherwise lead to larger and/or heavier basestations.

But RF modules that accommodate only one family of modulation techniques are economically inefficient by promoting high economic switching costs. Such an approach constrains future expansion, upgrades, and change options. In short, after purchasing hardware that supports only one family of modulation techniques, then the overall costs of all future expansion, upgrading, and changes will almost certainly be higher in the non-selected family of modulation techniques, even if otherwise technically and economically superior, because of high switching costs associated with changing between families of modulation techniques.

Typically, digital signal processing is available at a lower cost than that of corresponding analog processing. Thus, in order to lower basestation costs, RF module designs for either wide or narrow bandwidth modulation techniques attempt to process communication signals using digital techniques as much as practical. But the wide bandwidth family of modulation techniques presents particular challenges with respect to the wide bandwidth that must be accommodated to process a multiple channel CDMA signal. These challenges are exacerbated when higher harmonics of the multichannel baseband communication signal are to be processed to accommodate linearization of a high power amplifier. Although a high sample rate is demanded, the wide bandwidth family of modulation techniques lends itself to a great amount of digital processing to offset costs associated with the high sample rates demanded. Even direct upconversion, where image and LO leakage signal components fall in-band, is practical for multichannel CDMA signals because the specifications for adjacent channel power ratio (ACPR) are relatively modest. But tuning or adjusting operations to achieve optimal conditions may be required before even this modest specification can be met. Special tuning operations are undesirable because they increase manufacturing costs as well as ongoing costs due to an increased risk of becoming detuned in response to the ravages of time, temperature cycling, and jostling.

On the other hand, the narrow bandwidth family of modulation techniques presents particular challenges with respect to severe ACPR specifications. Typically, the narrow bandwidth family of modulation techniques results in more modest bandwidth requirements, even for a multichannel communication signal that accommodates higher harmonics for high power amplifier linearization. But the severe ACPR specifications typically results in an inability to use direct upconversion for a multichannel signal because image and LO leakage signal components need to be separated in frequency from the transmit band so that they may be filtered off to satisfy the severe ACPR specifications.

In accordance with conventional techniques, in order for an RF module to accommodate both families of modulations, the RF module will need to include the higher cost components otherwise unique to each family to meet the particular challenges of both families, resulting in a particularly expensive item that is likely to be larger and heavier.

SUMMARY OF THE INVENTION

It is an advantage of at least one embodiment of the present invention that an improved radio frequency (RF) transmitter and method therefor are provided.

Another advantage of at least one embodiment of the present invention is that an RF transmitter employs an RF module capable of accommodating a variety of both wideband and narrowband communication signals in a variety of frequency bands.

Another advantage of at least one embodiment of the present invention is that an RF transmitter utilizes digital processing at a sample rate which accommodates a wideband communication signal and a single analog upconversion stage for both wideband multichannel communication signals and narrowband multichannel communication signals.

Another advantage of at least one embodiment of the present invention is that an RF transmitter utilizes cancellation upstream of an analog upconversion stage to cancel local oscillator (LO) leakage components inserted by the analog upconversion stage.

Another advantage of at least one embodiment of the present invention is that an RF transmitter is provided that accommodates both wideband and narrowband multichannel communication signals at no appreciable increase in cost, size, or weight when compared to a corresponding RF transmitter that accommodates either only a wideband multichannel communication signal or only a narrowband multichannel communication signal.

These and other advantages are realized in one form by an RF transmitter which includes a communication signal source configured to supply a communication signal. An upconverter is coupled to the communication signal source and configured to generate an RF form of the communication signal, where the RF form of the communication signal has a local oscillator (LO) leakage component therein. A combiner is coupled to said upconverter, and a power amplifier is adapted to amplify the RF form of the communication signal for broadcast from the RF transmitter. A downconverter is adapted to receive a portion of the RF form of the communication signal and to produce a return baseband signal from this portion. An LO leakage detector is coupled to the downconverter and to the combiner. The LO leakage detector is configured to generate a combining signal in response to the RF form of the communication signal which, when combined with the communication signal in the combiner, at least partially cancels the LO leakage component.

The above and other advantages are realized in another form by a method of operating an RF transmitter. The method calls for determining whether or not the transmitter will transmit a wideband communication signal. The method also provides a baseband digital data stream which conveys a plurality of channels separated in frequency from one another and which exhibits a baseband center frequency ($F_{BB}$) for all of the plurality of channels that is less than a bandwidth which spans all of the channels. When the determining activity of the method determines that the transmitter will not transmit a wideband communication signal, the method digitally shifts the plurality of channels in frequency to produce an intermediate frequency (IF) digital data stream for which an IF center frequency ($F_{IF}$) is greater than the bandwidth that spans all of the channels. Then the method calls for converting the IF digital data stream into an analog IF communication signal and upconverting the analog IF communication signal to a radio-frequency (RF) communication signal having an RF center frequency ($F_{RF}$).

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
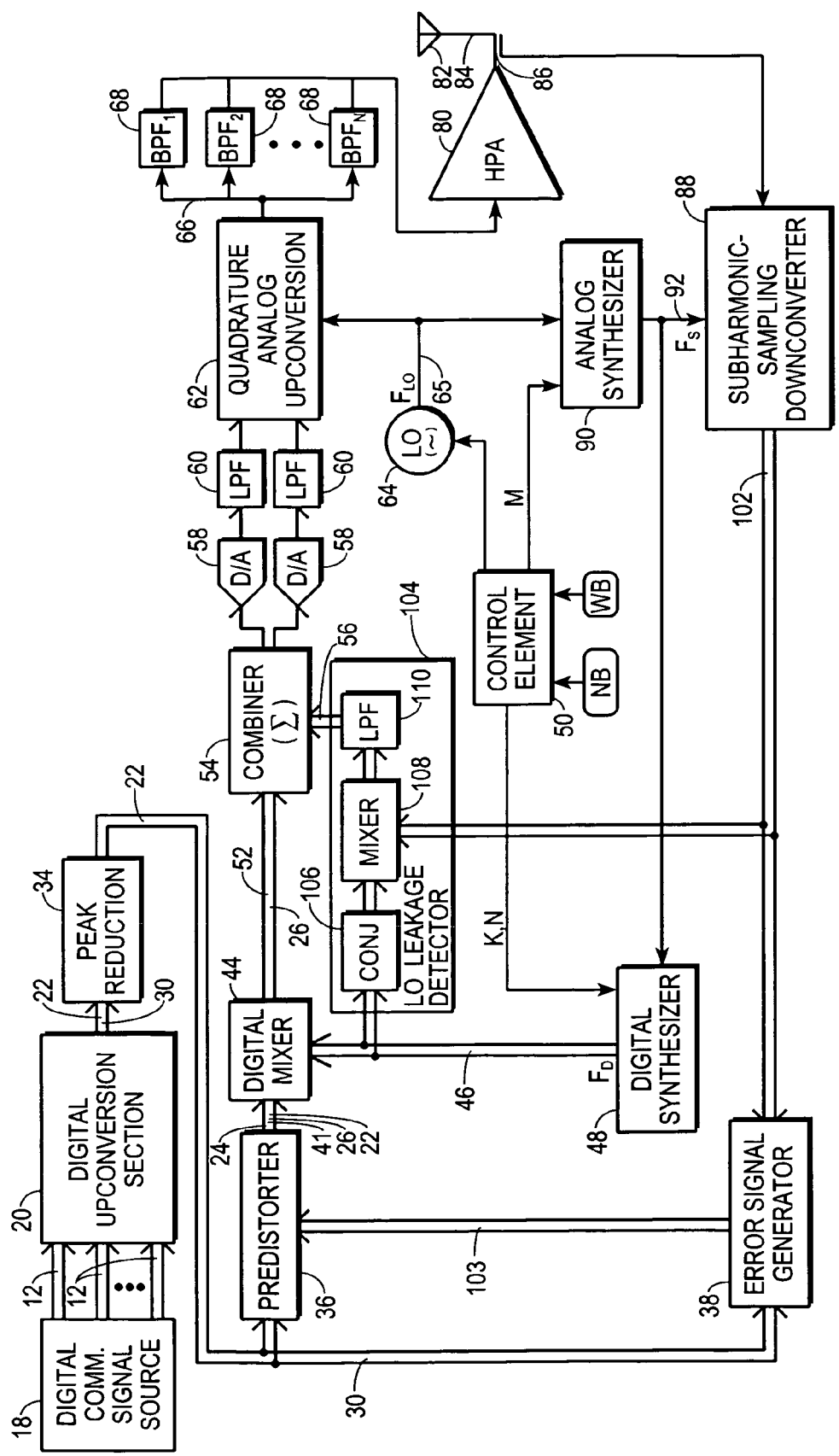
FIG. 1 shows a block diagram of an RF transmitter configured in accordance with the teaching of the present invention.

FIG. 1 shows a block diagram of a radio-frequency (RF) transmitter 10 configured in accordance with the teaching of the present invention. In the preferred embodiment, RF transmitter 10 is configured to serve as a portion of a cellular basestation, but that is not a requirement of the present invention. Moreover, RF transmitter 10 is compatible with and exceeds the minimum requirements of an RF module as set forth in the Open Base Station Architecture Initiative (OBSAI), but that too is no requirement of the present invention. Those skilled in the art will appreciate that RF transmitter 10 may be used in a variety of RF transmission applications whether or not such applications are viewed as being cellular applications.

Referring to FIG. 1, a plurality of individual, baseband (BB) communication signals 12 are provided by a digital communication signal source 18. In accordance with the OBSAI, signal source 18 may be provided by terminals, ports, data paths, conductors, and the like that propagate baseband communication signals from one or more baseband modules (not shown) through what the OBSAI calls a reference point 3 (RP3) interface to an RF module. While FIG. 1 suggests that the individual BB communication signals 12 are supplied in parallel over different paths, this is no requirement, and the individual BB communication signals 12 may be supplied serially over a common path. While any number of BB communication signals 12 may be supplied by digital signal source 18, the preferred embodiment contemplates that four discrete BB communication signals 12 will be processed by RF transmitter 10. A cellular basestation or other RF transmission applications may include several RF transmitters 10 to effect the transmission of additional BB communications signals as needed.

The individual communication signals 12 convey user-supplied data. User-supplied data describe the information that RF transmitter 10 is provided to transmit. User-supplied data are the data that causes one to provide RF transmitter 10 in the first place. Such user-supplied data are not provided primarily for system or control purposes, such as for testing or calibration. Rather, a user of a communication system (not shown) of which RF transmitter 10 is a part desires the user-supplied data to be transmitted to and received by a receiver (not shown) remotely located from RF transmitter 10, thereby effecting communication of the user-supplied data. The source and nature of user-supplied data are of no importance for RF transmitter 10, other than to be digitally-baseband modulated in accordance with a recognized standard with which RF transmitter 10 is compatible.

And, RF transmitter 10 is desirably configured to be compatible with a wide variety of such standards. In the preferred embodiment, RF transmitter 10 is compatible with any of the digital communication standards listed in Table I, presented above. But, in some embodiments, analog components, such as one or more of high power amplifiers, local oscillators, and bandpass filters, may need to be installed in RF transmitter 10 for compatibility with a particular licensed frequency band within which RF transmitter 10 will be used.

In particular, RF transmitter 10 is desirably configured to be compatible with entirely different families of modulations that may be applied to individual BB communication signals 12. In the preferred embodiment, RF transmitter 10 is compatible with all narrowband, Global System for Mobile communications (GSM) digital modulation formats listed in Table I above, including Gaussian minimum shift keying (GMSK), 8-PSK, EGSM, EDGE, and like modulation formats. The same RF transmitter 10 is also compatible with all wideband, code division multiple access (CDMA) digital modulation formats listed in Table I above, including CDMA, WCDMA, CDMA 2000, and the like. Moreover, RF transmitter 10 is compatible with the more recent open-standard wideband transmission modulations using orthogonal frequency-division multiplexing (OFDM), such as 802.11 (WiFi) and 802.16 (WiMAX), treating these wideband waveforms as it does CDMA.

By accommodating entirely different families of modulation formats in a single RF transmitter, system switching costs associated with future expansions, upgrades, enhancements, changes, and the like are considerably reduced, and economic efficiency is promoted. As is described in more detail below, this reduction in future switching cost is provided at no significant increase in initial costs and at no significant increase in weight or size.

Figure 2:
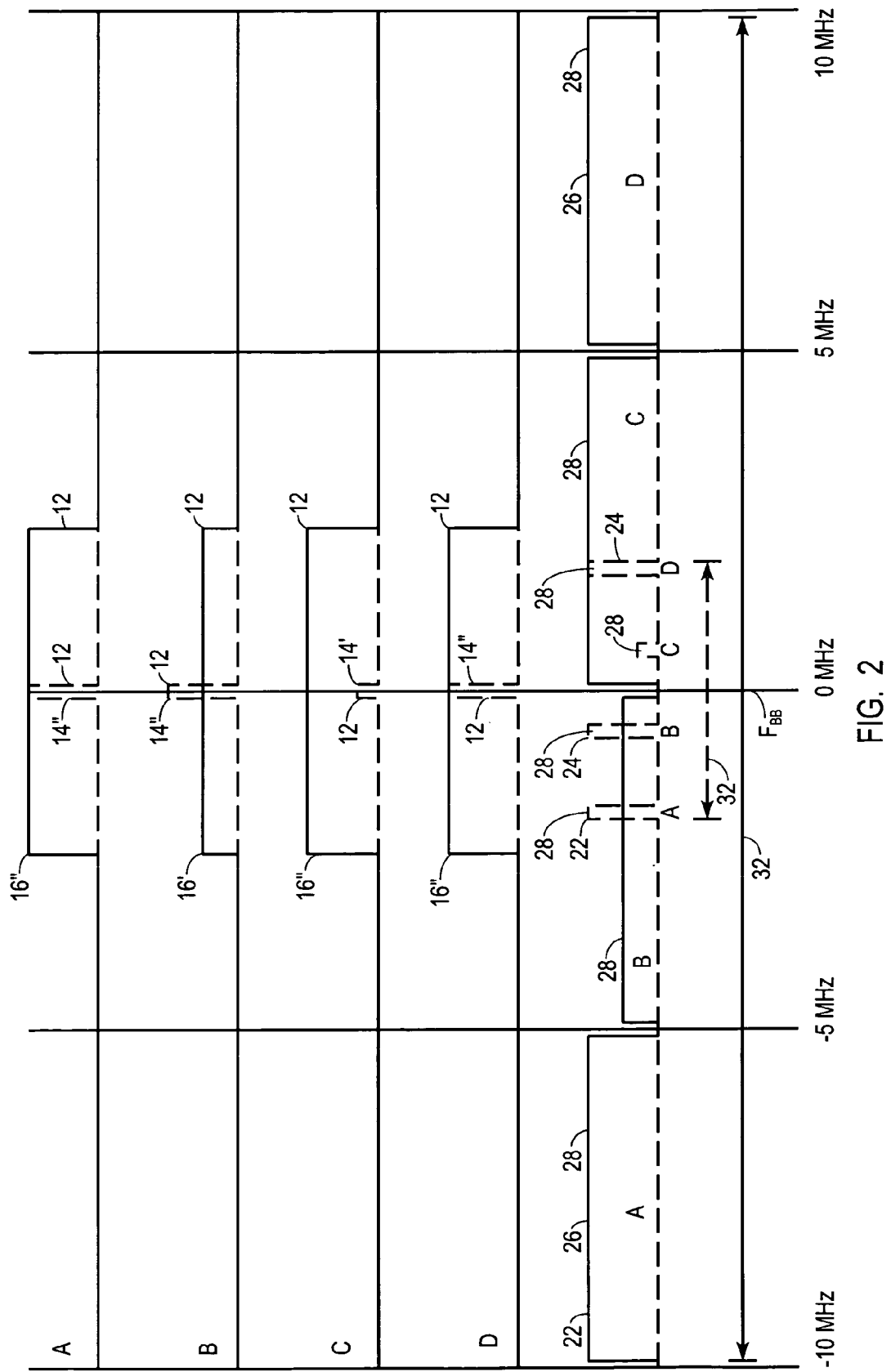
FIG. 2 shows a spectral chart of a plurality of channels during baseband processing within the RF transmitter depicted in FIG. 1.

FIG. 2 shows a spectral chart for a plurality of channels during baseband processing within RF transmitter 10. For purposes of explanation herein, individual BB communication signals 12 are divided into two different families of BB communication signals 12, distinguished from one another by bandwidth. For the purposes of the present invention, narrowband (NB) signals and the narrow bandwidth family are defined as having bandwidths of less than 750 KHz per channel while wideband (WB) signals and the wide bandwidth family are defined as having bandwidths of greater than 750 KHz. Traditionally, GSM modulations have a bandwidth of around 200 KHz and are considered narrowband modulations both under the definitions presented herein and by those skilled in the art. CDMA and OFDM modulations have bandwidths in excess of 1.0 MHz and are considered wideband modulations both under the definitions presented herein and by those skilled in the art.

Narrowband BB communication signals 12 are referred to herein as NB-BB communication signals 14 and are depicted in FIG. 2 by dotted line traces. Wideband BB communication signals 12 are referred to herein as WB-BB communication signals 16 and are depicted in FIG. 2 by solid line traces. Either NB-BB communication signals 14 or WB-BB communication signals 16 may be processed by RF transmitter 10, but NB-BB communication signals 14 and WB-BB communication signals 16 are not processed by RF transmitter 10 simultaneously.

FIG. 2 illustrates that four individual BB communication signals 12 (either four NB-BB communication signals 14 or four WB-BB communication signals 16) are provided from digital communication signal source 18. The four individual communication signals 12 are distinguished from one another by the characters "A", "B", "C", and "D". As depicted in FIG. 2, NB-BB communication signals 14 have a significantly narrower bandwidth than WB-BB communication signals 16. Preferably, BB communication signals 12 are complex signals having in-phase (I) and quadrature-phase (Q) components. Hence FIG. 2, uses a positive and negative notation for the spectrum occupied by BB communication signals 12. But those skilled in the art will appreciate that the BB communication signals 12 may also be represented as real signals.

FIG. 2 also shows that some of BB communication signals 12 may exhibit a higher power level than others. In particular, NB-BB communication signal 14' shown in trace C is at a lower amplitude than the other NB-BB communication signals 14", and WB-BB communication signal 16' shown in trace B is at a lower amplitude than the other WB-BB communication signals 16". The difference in power levels may result when, for example, a base station which incorporates RF transmitter 10 is near a first mobile station (not shown) for which the lower amplitude signals 14" or 16' are intended but farther away from second through fourth mobile stations for which the higher amplitude signals 14" or 16" are intended. A gain-applying stage (not shown) which is responsible for the differences in power levels may be included in or upstream of digital communication signal source 18.

The differences in power levels are noteworthy in connection with a multichannel communication signal because they effect the ability of RF transmitter 10 to meet adjacent channel power ratio (ACPR) specifications, which are more severe in connection with narrowband modulations than for wideband modulations. The differences in bandwidth are noteworthy in connection with a multichannel communication signal because they effect the minimum sample rates at which digital data must be processed within RF transmitter 10. The minimum sample rates are more severe in connection with wideband modulations than for narrowband modulations. But the ability to meet the higher sample rates typically demanded by wideband modulations can be provided by digital signal processing which can generally be provided at lower cost than analog signal processing.

Referring to FIGS. 1 and 2, individual BB communication signals 12 are provided to a digital upconversion and combination section 20. Section 20 shifts BB communication signals 12 in frequency as needed using conventional digital upconversion techniques to form a digital, multichannel, BB communication signal 22 in which the plurality of individual BB communication signals 12 has been modulated into a plurality of channels 28 and otherwise combined in a single data stream 30. Channels 28 are separated in frequency from one another within data stream 30. But digital, multichannel, BB communication signal 22 is still a baseband signal. In other words, BB communication signal 22 exhibits a baseband center frequency ($F_{BB}$) for all of the plurality of channels 28 that is preferably at or near 0 Hz, as depicted in FIG. 2, but in any event less than a bandwidth 32 that spans all of the plurality of channels 28.

Data stream 30 may then be further processed within RF transmitter 10 at baseband to perform a number of different digital signal processing functions. One such function may be performed in a peak or crest reduction section 34. Other functions may also be performed. But eventually, the baseband form of data stream 30 is provided to a digital predistorter 36. For purposes of the present discussion, BB communication signal 22 conveyed by data stream 30 is considered to be in a raw form when input to predistorter 36, regardless of any upstream processing that may have been performed. This raw form of data stream 30 is also input to an error signal generator 38. Predistorter 36 and error signal generator 38 work together to intentionally distort the spectral content of BB communication signal 22 in a manner which will compensate for both linear and nonlinear distortions introduced downstream of predistorter 36 by analog signal processing. Predistorter 36 thus provides a predistorted baseband digital data stream 41.

Figure 3:
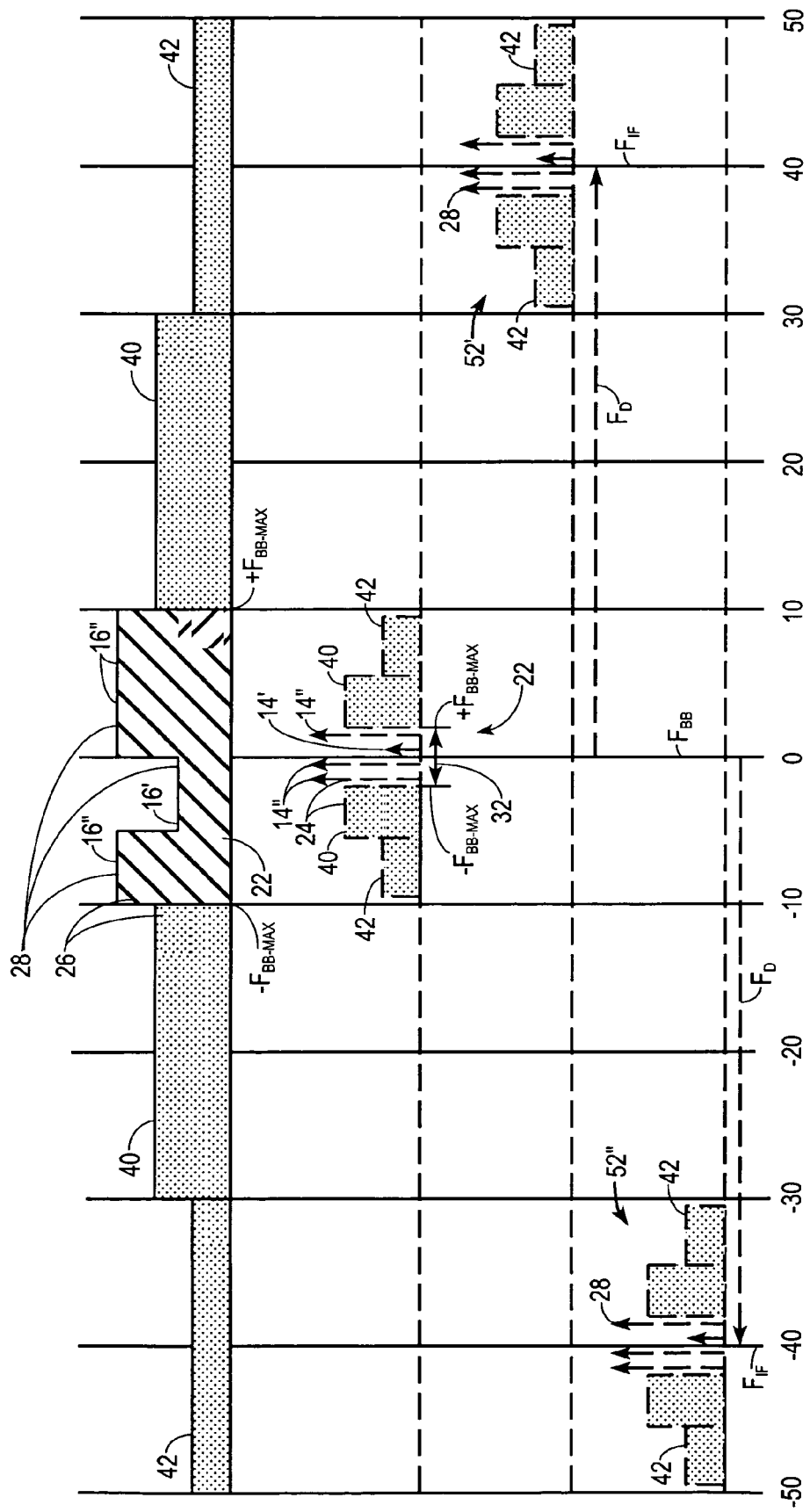
FIG. 3 shows a spectral chart of a plurality of channels during intermediate frequency (IF) processing within the RF transmitter depicted in FIG. 1.

FIG. 3 shows a spectral chart of the plurality of channels 28 during intermediate frequency (IF) processing within RF transmitter 10. Referring to FIGS. 2-3, multichannel BB communication signal 22 is represented as being divided into two different families of multichannel BB communication signals 22, distinguished from one another by digital modulation format. Narrowband, multichannel BB communication signals 22 are referred to herein as NB multichannel communication signals 24 and are depicted in FIGS. 2 and 3 by dotted line traces. Wideband, multichannel BB communication signals 22 are referred to herein as WB multichannel communication signals 26 and are depicted in FIGS. 2 and 3 by solid line traces.

The top two traces of FIG. 3 respectively depict WB multichannel communication signal 26 and NB multichannel communication signal 24 in baseband form, with center frequencies $F_{BB}$ near 0 Hz. In addition, FIG. 3 depicts third and fifth harmonic bands 40 and 42 for the respective multichannel BB communication signals 24 and 26. In the preferred embodiment, since predistorter 36 predistorts to compensate for nonlinear distortion, the spectral content of any multichannel BB communication signal 22, 24, or 26 expands to accommodate harmonics of the highest frequencies in the bandwidth 32 that spans all of the channels 28. In the preferred embodiment, at least a third harmonic 40, and more preferably a fifth harmonic 42, of a maximum frequency ($F_{BB-MAX}$) exhibited by channels 28 with a center frequency at $F_{BB}$ is accommodated by predistorter 36. These higher harmonics are accommodated by increasing the sample rate to at least accommodate the Nyquist rate for $F_{BB-MAX}$ (i.e., $2F_{BB-MAX}$).

FIG. 3 illustrates, in the top two traces, that WB multichannel communication signal 26 requires processing over considerably more bandwidth than NB multichannel communication signal 24, particularly when the third and fifth harmonics of $F_{BB-MAX}$ are supported. But since predistorter 36 performs digital processing, no significant additional expense is required to accommodate the greater bandwidth of WB multichannel communication signal 26, up to the maximum capability of the semiconductor process technology, such as CMOS, used to implement the digital portion of RF transmitter 10. In other words, at virtually no cost, digital processing provides greater bandwidth than is actually required to meet the Nyquist sampling rate for NB multichannel communication signal 24 and provides just enough bandwidth to meet the Nyquist sampling rate for WB multichannel communication signal 26.

Referring to FIGS. 1 and 3, an output of predistorter 36 couples to an input of a digital mixer 44 so that predistorted BB data stream 41 is supplied to digital mixer 44. Digital mixer 44 digitally shifts multichannel communication signal 22, as conveyed by predistorted BB data stream 41, in frequency by an amount determined by the frequency of a complex, digital intermediate frequency (IF) oscillation signal 46 ($F_D$). IF signal 46 ($F_D$) is generated by an oscillator in the form of a digital synthesizer 48, which has an output coupled to an input of digital mixer 44. Digital synthesizer 48 has a control input coupled to an output of a control element 50.

Control element 50 is configured to determine whether or not RF transmitter 10 is being used to transmit a WB multichannel communication signal 26 or a NB multichannel communication signal 24. Based on this determination, control element 50 causes digital synthesizer 48 to generate IF oscillation signal 46 at either substantially 0 Hz, for WB multichannel communication signal 26, or at an IF frequency of $F_D$ for NB multichannel communication signal 24. The frequency of IF signal 46 ($F_D$) is set to distinctly shift NB multichannel communication signal 24 away from baseband. In particular, $F_D$ is configured to shift the plurality of channels 28 in frequency so that an IF center frequency ($F_{IF}$) for all of channels 28 is then greater than the bandwidth 32 that spans all of channels 28. In other words, $F_D=F_{IF}-F_{BB}$, $F_D=F_{IF}$ when $F_{BB}=0$ Hz, and $F_{IF}>$bandwidth 32. In the preferred embodiment, IF signal 46 ($F_D$) is in the range of 20-40 MHz for narrowband multichannel communication signal 24, but that is not a requirement of the present invention.

When the determination made by control element 50 indicates that WB multichannel communication signal 26 is being transmitted from RF transmitter 10, control element 50 causes digital synthesizer 48 to generate IF oscillation signal 46 at around 0 Hz (e.g., $F_D=0$). In other words, digital mixer 44 provides no appreciable frequency shift for WB multichannel communication signal 26, WB multichannel communication signal 26 remains at baseband, and the center frequency of WB multichannel communication signal 26 remains at $F_{BB}$, which is less than bandwidth 32.

Those skilled in the art will appreciate that other techniques may be used to shift NB multichannel communication signal 24 in frequency to a center frequency of $F_{IF}$ while refraining from shifting WB multichannel communication signal 26 away from baseband center frequency $F_{BB}$. For example, a switching circuit may be used to switch digital mixer 44 out of data stream 41 when WB modulated multichannel communication signal 26 is being processed. This and other adaptations are intended to be included within the scope of the present invention.

Control element 50 may be configured in a variety of different ways. In a preferred embodiment, control element 50 is provided by a microprocessor or microcontroller and attendant circuits, such as memory and data latches, that are programmed with initialization parameters when RF transmitter 10 is placed in service, but may be reprogrammed from time to time. Such initialization parameters may be evaluated by the above-discussed determination made by control element 50. But in alternative embodiments, hardware jumpers, on-board switches, or system-level wiring may be configured to indicate the type of modulation families being transmitted by RF transmitter 10.

The bottom two traces of FIG. 3 depict two different NB-IF multichannel communication signals 52 that can result from the operation of digital mixer 44. One or the other of these different NB signals will be generated, but not both at the same time. An upper-sideband version 52' of NB-IF multichannel communication signal 52 is depicted in the third trace from the top in FIG. 3, and a lower-sideband version 52" of NB-IF multichannel communication signal 52 is depicted in the bottom trace of FIG. 3. Those skilled in the art will appreciate that a selected sideband will result from causing digital synthesizer 48 to generate IF signal 46 in a normal or conjugate form. With either sideband, no appreciable image signal results due to the use of the complex representation for multichannel signal 24 and due to digital processing which performs a nearly perfect upconversion, at least when compared to a corresponding analog signal processing function.

An output of digital mixer 44 couples to an input of a digital combiner 54 which desirably performs a mathematical addition or subtraction operation. Combiner 54 performs a local oscillator (LO) leakage compensation operation. In particular, combiner 54 inserts a combining signal 56 into the NB-IF multichannel communication signal 52 or WB-BB multichannel communication signal 26 that is supplied to it from digital mixer 44. Combining signal 56 substantially exhibits BB center frequency $F_{BB}$ in an amplitude and polarity that, when upconverted to RF in a subsequent analog signal processing stage will compensate for LO leakage. Combining signal 56 is responsive to IF oscillation signal 46 in the preferred embodiment. The generation of combining signal 56 is discussed in more detail below.

Complex I and Q outputs from combiner 54 couple to respective digital-to-analog (D/A) converters 58. At D/A converters 58, signal processing is transformed from digital processing into analog processing. Signal processing which takes place in D/A converters 58 and subsequent processing of the communication signal in the downstream direction (i.e., propagating toward an antenna from which the communication signal will be broadcast) will take place using analog components. Thus, the subsequent signal processing is subject to the inaccuracies characteristic of analog processing. For example, the two different D/A converters 58 may not exhibit precisely the same gain and may introduce slightly different amounts of delay. Such differences in gain and delay can lead to linear distortion in the communication signal. Moreover, so long as the different legs of the complex signal are processed separately in different analog components, the components are likely to apply slightly different frequency responses so that linear distortion is worsened by the introduction of frequency-dependent gain and phase imbalances. And, the frequency-dependent gain and phase imbalances worsen as the bandwidth of the communication signal widens.

The two complex legs of the analog communication signal pass from D/A converters 58 to two low-pass filters (LPF's) 60. LPF's 60 can be the source of additional linear distortion by applying slightly different gains and phase shifts in addition to slightly different frequency-dependent characteristics. From LPF's 60 the two complex legs of the analog communication signal pass to a quadrature analog upconverter 62. Upconverter 62 mixes the two complex legs with a local-oscillator signal exhibiting a local-oscillator frequency ($F_{LO}$) and obtained from a local oscillator 64 in a manner known to those skilled in the art. In the preferred embodiment, local oscillator 64 produces an LO signal 65 which oscillates at a frequency that can be specified by control element 50. Additional linear distortion in the form of gain and phase imbalance may be introduced as well as LO leakage (i.e., leakage of LO signal 65 into the communication signal). In addition, upconverter 62 combines the two distinct legs of the complex communication signal and passes the combined signal, now an RF multichannel communication signal 66, to at least one and preferably a bank of band-pass filters (BPF's) 68.

Figure 4:
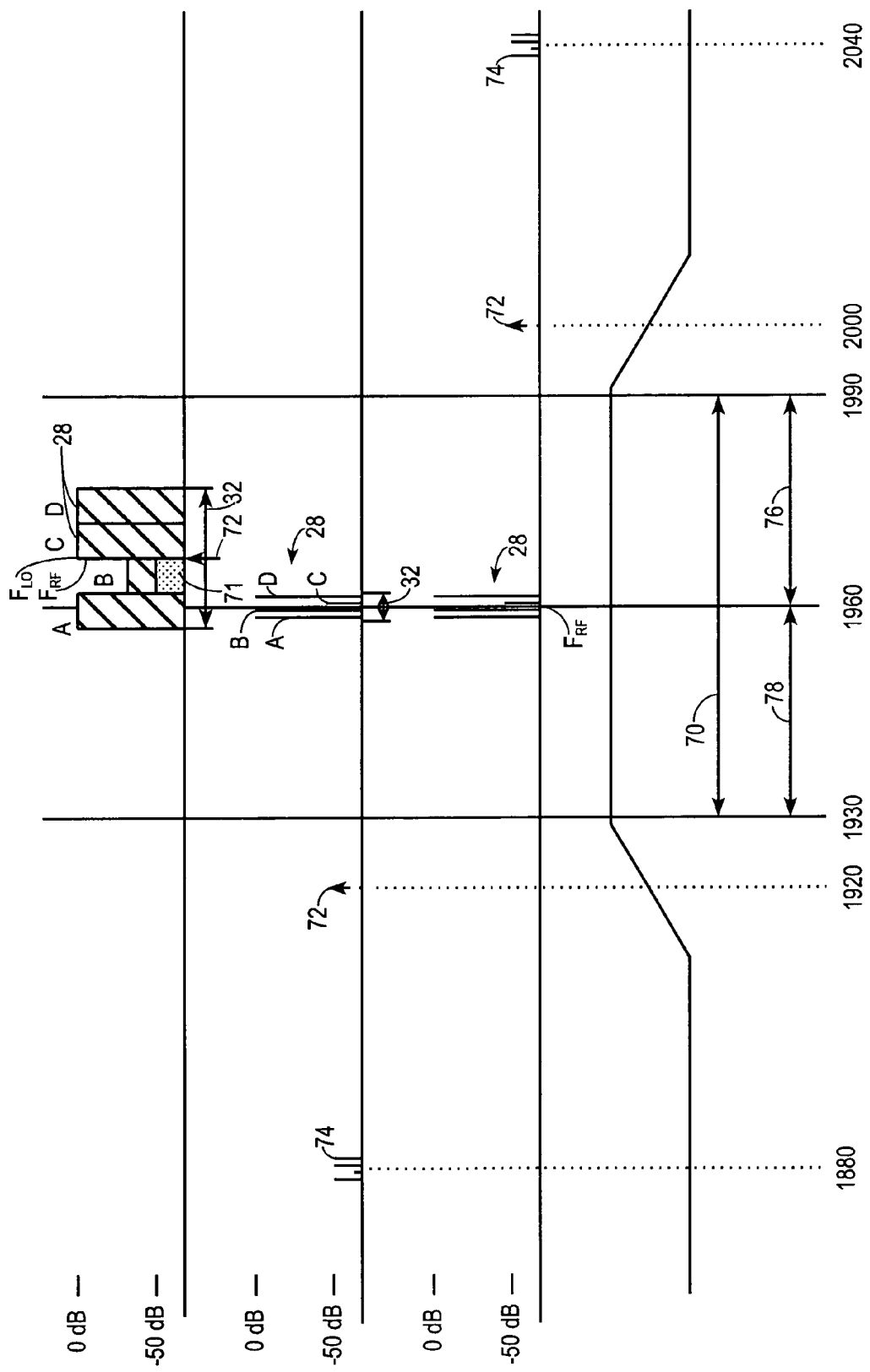
FIG. 4 shows a spectral chart of a plurality of channels during radio frequency (RF) processing within the RF transmitter depicted in FIG. 1.

FIG. 4 shows a spectral chart for channels 28 during radio frequency (RF) processing, primarily at upconverter 62, within RF transmitter 10. FIG. 4 depicts an exemplary situation where upconversion at upconverter 62 shifts the communication signal received at upconverter 62 to RF within a licensed frequency band 70 that extends from 1930 MHz to 1990 MHz. Those skilled in the art will appreciate that a licensed frequency band is established by a governmental licensing agency for the geopolitical area over which the governmental licensing agency has jurisdiction, but otherwise may be an arbitrary frequency band that spans a contiguous frequency range at least equal to bandwidth 32. Moreover, those skilled in the art will appreciate that this example is for purposes of explanation only and that upconversion may cause RF communication signal 66 to exhibit a center frequency in any of the licensed frequency bands depicted in Table I above, or in other frequency bands.

The top trace in FIG. 4 depicts the wideband modulation case. When the communication signal processed by upconverter 62 is WB multichannel, baseband communication signal 26, upconverter 62 performs a direct upconversion. LO frequency $F_{LO}$ resides in or near the center of the bandwidth 32, whose center frequency is now referred to as $F_{RF}$, and is collectively occupied by the four channels 28. Thus, any LO leakage 72 falls in-band (i.e., within bandwidth 32 centered at $F_{RF}$) where it cannot be filtered off. Nevertheless, the LO leakage cancellation performed upstream in combiner 54 when used in combination with an inexpensive quadrature analog upconverter 62 of modest quality will permit LO leakage to remain below the relative modest LO leakage specifications characteristic of wideband modulation formats. Moreover, the cancellation will adapt to the specific instances of analog components included in RF transmitter 10 and adapt as needed to accommodate changes due to time, temperature cycling, jostling, and the like. Consequently, no adjustments are required to cause LO leakage to remain below specifications.

Those skilled in the art will appreciate that the images of each of the channels 28 will also fall in-band. Images will result from quadrature imbalances and other linear distortions that are invariably introduced by signal processing using analog components. The images appear at RF the same distance in frequency away from $F_{LO}$ as the channels 28 that produce the images, but in the opposite polarity. Thus, with reference to FIGS. 2 and 4, the image from channel C falls on channel B, and vice-versa, and the image from channel D falls on channel A, and vice-versa.

When one of the channels 28 is at a lower amplitude than the channel 28 whose image falls thereon, an adjacent channel power ratio (ACPR) requirement must nevertheless be observed. But, the specifications for ACPR are relatively modest for wideband modulation formats, at least when compared to narrowband modulation formats. The linear predistortion performed upstream in predistorter 36 when used in combination with an inexpensive quadrature analog upconverter 62 of modest quality will permit image signals to remain below the relatively modest ACPR specifications characteristic of wideband modulation formats. The top trace of FIG. 4 depicts an image 71 from channel C which falls on channel B, but is nevertheless sufficiently lower than channel B in power to meet the ACPR specifications, even when channel C is at a maximum power level and channel B at a minimum power level.

The middle two traces of FIG. 4 depict narrowband modulation cases. When the communication signal processed by upconverter 62 is NB-IF multichannel communication signal 52, upconverter 62 performs a final upconversion. LO frequency $F_{LO}$ desirably resides outside of the multichannel bandwidth 32 centered at $F_{RF}$ and collectively occupied by the four channels 28 now at RF. The LO frequency $F_{LO}$ and any LO leakage 72 resulting from the LO signal are positioned a distance of $F_{IF}$ away from $F_{RF}$. In the preferred embodiment, $F_{LO}$ now resides outside of licensed frequency band 70, but this not a requirement. The LO leakage cancellation performed upstream in combiner 54, when used in combination with an inexpensive quadrature analog upconverter 62 of modest quality, will permit LO leakage to remain below most LO leakage specifications characteristic of even narrowband modulation formats.

The middle two traces of FIG. 4 also show images 74 for RF multichannel communication signal 66 positioned even farther away from bandwidth center frequency $F_{RF}$ than LO leakage 72. In particular, images 74 are positioned a distance of $2F_{IF}$ in frequency away from $F_{RF}$. Those skilled in the art will appreciate that the difference between the two middle traces in FIG. 4 is that the second trace from the top shows RF multichannel communication signal 66 configured as an upper-sideband and that the third trace from the top shows RF multichannel communication signal 66 as a lower-sideband. When the upper-sideband configuration is used, image 74 is lower in frequency than licensed frequency band 70. When the lower-sideband configuration is used, image 74 is higher in frequency than licensed frequency band 70. Those skilled in the art will appreciate that the upper- and lower-sideband configurations correspond to the upper- and lower-sideband configurations shown in the bottom two traces in FIG. 3 and can be determined by generating IF oscillation signal 46 ($F_D$) in a normal or conjugate form in digital synthesizer 48 (FIG. 1).

At least one of bandpass filters (BPF's) 68 is desirably configured for the particular licensed frequency band 70 where RF multichannel communication signal 66 now resides, as shown in the bottom trace of FIG. 4. Thus, the response of that BPF 68 is configured to attenuate the one of the upper- and lower-sidebands that resides outside the licensed frequency band 70. Accordingly, images 74 for narrowband communication signals are further attenuated through BPF 68 so that they meet the somewhat severe ACPR specifications characteristic of narrowband modulation formats. BPF 68 may, and desirably does, also attenuate any LO leakage 72 that may be present in RF multichannel communication signal 66 for narrowband modulation formats.

Referring back to FIG. 1, in the preferred embodiment any number of BPF's 68 may be included and have inputs coupled to the output of upconverter 62. The different BPF's 68 are desirably configured to have different passbands which correspond to the different licensed frequency bands 70 in which RF transmitter 10 may transmit. Although not shown, inputs and/or outputs of BPF's 68 may be switched into the signal path when needed for a particular frequency band and switched out of the signal path when not needed to limit the introduction of noise. Low power BPF's are inexpensive and small analog components. Thus, the inclusion of multiple BPF's 68 makes RF transmitter 10 more readily configurable for operation in a different frequency band or with different modulation formats.

Referring back to FIG. 3, the bottom two traces illustrate that the baseband communication signal for narrowband modulation formats is shifted so that an IF center frequency $F_{IF}$ is now greater than the multichannel bandwidth 32 for the baseband communication signal. But these two traces also show that there is a limit as to how high IF center frequency $F_{IF}$ can be. In the embodiment depicted in FIG. 3, NB-BB multichannel communication signal 24 is shifted as far as possible within the sampling rate and digital signal processing constraints that accommodate the wider bandwidth, WB-BB multichannel communication signal 26. In other words, fifth harmonic band 42 for NB-IF multichannel communication signal 52 is positioned at no greater frequency than falls within fifth harmonic band 42 for WB-BB multichannel communication signal 26. In alternate embodiments, a seventh or even ninth harmonic band of NB-IF multichannel communication signal 52 may be so positioned with respect to the fifth harmonic band for WB-BB multichannel communication signal 26.

A consequence of the upper limit on the amount by which NB-IF multichannel communication signal 52 may be shifted in frequency from baseband is that LO leakage 72 and/or image 74 may, in some embodiments, approach or fall within licensed frequency band 70 if RF multichannel communication signal 66 is positioned more than one-half the distance across licensed frequency band 70 from image 74. Thus, in the preferred embodiment, licensed frequency band 70 is divided into an upper-half licensed sub-band 76 and a lower-half licensed sub-band 78. When RF multichannel communication signal 66 resides predominately in lower-half licensed sub-band 78, the upper-sideband configuration depicted in the second trace from the top in FIG. 4 is utilized. And when RF multichannel communication signal 66 resides predominately in upper-half licensed sub-band 76, the lower-sideband configuration depicted in the third trace from the top in FIG. 4 is utilized. This prevents LO leakage 72 and image 74 from encroaching upon licensed frequency band 70 any more than occurs when RF multichannel communication signal 66 resides precisely in the center of licensed frequency band 70.

Referring back to FIG. 1, BPF 68 is configured to block unwanted sidebands in RF communication signal 66 as discussed above, but will also introduce additional phase delay into RF communication signal 66. RF communication signal 66 drives a power amplifier 80, also conventionally called a high-power amplifier (HPA). HPA 80 couples to an antenna 82 and produces an amplified RF communication signal 84. HPA 80 is likely to be the source of a variety of linear and nonlinear distortions introduced into amplified RF communication signal 84.

RF transmitter 10 uses feedback obtained from amplified RF communication signal 84 to control the nature and amount of predistortion applied by predistorter 36 and the nature and amount of combining signal 56 which cancels LO leakage in combiner 54. Thus, a directional coupler 86 has an input port coupled to an output of HPA 80 and output ports coupled to antenna 82 and to a subharmonic-sampling downconverter 88. Directional coupler 86 extracts a portion of amplified RF communication signal 84 and causes that portion to be downconverted in downconverter 88. In one embodiment, a duplexer (not shown) is positioned between HPA 80 and antenna 82, and directional coupler 86 is located on the antenna side of the duplexer.

While a subharmonic-sampling downconverter is excessively noisy for many applications, the excessive noise poses no problem for RF transmitter 10. And, the use of digital techniques to directly downconvert from RF to baseband, as occurs in subharmonic-sampling downconverter 88, is desirable because analog processing would introduce quadrature imbalances and other linear distortions that would bias the feedback signal and lead to an inaccurate representation of amplified RF communication signal 84. A clock input of downconverter 88 couples to an output of an oscillator in the form of an analog synthesizer 90, which has an input that couples to local oscillator 64 and is driven by LO signal 65. Accordingly, the sampling of downconverter 88 is phase synchronized to LO oscillator signal 65. And, a control input of analog synthesizer 90 couples to an output of control element 50.

Control element 50 is configured to provide a variable ("M") that defines the amount by which LO signal 65 is divided to produce a clock signal 92 for downconverter 88 at a sampling rate $F_S$. In particular, synthesizer 90 is desirably configured to multiply LO signal 65 by four and divide the resulting product by an odd number, characterized as 2M±1, where M is a positive integer chosen to satisfy the Nyquist criteria for the higher harmonics processed by predistorter 36. In the examples illustrated in FIG. 3, the third and preferably fifth harmonic bands 40 and 42 represent these higher harmonics.

Figure 5:
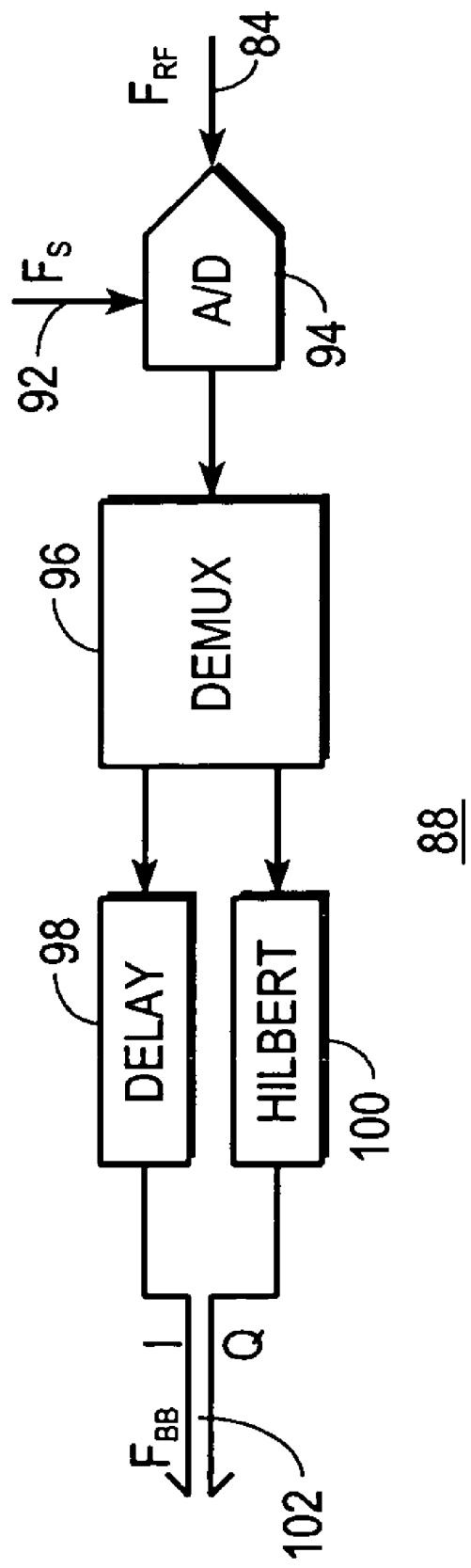
FIG. 5 shows a block diagram of one embodiment of a subharmonic-sampling downconverter suitable for use in the RF transmitter depicted in FIG. 1.

FIG. 5 shows a block diagram of one embodiment of subharmonic-sampling downconverter 88 which is suitable for use in RF transmitter 10. The subharmonic sampling is performed through an analog-to-digital (A/D) converter 94. The direct-subharmonic-sampling-downconversion process performed by A/D converter 94 over a wide range of licensed frequency bands 70 (FIG. 4) that includes frequencies higher than 2000 GHz suggests that A/D converter 94 be capable of high-speed conversions. In the preferred embodiment, downconverter 88 is provided on a common semiconductor substrate with the other digital processing blocks in RF transmitter 10 that may be predominantly manufactured using a CMOS process. But the high speed requirements of A/D converter 94 may be provided for by using a SiGe process which is compatible with CMOS processing.

A/D converter 94 produces a digital data stream that is routed to a demultiplexer (DEMUX) 96, which separates the stream into even-and-odd-sample-data streams. One of these even-and-odd-sample-data streams is merely delayed in a delay element 98, while the other is transformed in a Hilbert-transformation section 100. Outputs from delay element 98 and section 100 collectively serve as complex-return-data stream 102. The use of subharmonic sampling to perform downconversion, particularly with a high speed A/D converter 94, results in complex-return-data stream 102 that is a highly accurate downconversion of amplified RF communication signal 84, at least over an extended period of time, but that at any given instant may be an imprecise downconversion of amplified RF communication signal 84 due to resolution limitations of A/D converter 94. Of course, the rates of the data streams slow as they propagate through downconverter 88, and clock signals are appropriately divided down (not shown) to support the decreasing data rates.

FIG. 5 depicts one form of a subharmonic-sampling downconverter suitable for use as downconverter 88. But those skilled in the art can devise other forms of direct-digital-subsampling downconverter that will also be acceptable. While direct downconversion is desirable because it does not introduce different analog inaccuracies into the I and Q legs which can lead to linear distortion or other analog inaccuracies, in higher-frequency applications (e.g., greater than 2.5 GHz) downconversion may be performed in two stages, with the first stage being an analog downconversion. In this situation distortion introduced by the first analog downconversion stage will be less significant because it will be applied over a significantly narrower bandwidth as a percentage of the RF carrier frequency.

Referring back to FIG. 1, complex-return-data stream 102 from downconverter 88 is supplied to inputs of an LO leakage detector 104 and error signal generator 38. Error signal generator 38 includes variable delay elements (not shown) and subtraction circuits (not shown). The variable delay elements are adjusted to delay the raw form of data stream 30 into temporal alignment with return-data stream 102, and an error signal 103 is formed by subtracting return-data stream 102 from this delayed version of raw data stream 30. Error signal 103 is fed to a control input of predistorter 36.

In order for error signal 103 to successfully control the character of predistortion applied in predistorter 36, return-data stream 102 and raw data stream 30 are desirably locked at the same frequency and phase. Accordingly, it is desirable that downconverter 88 downconvert amplified RF communication signal 84 as precisely as possible to the baseband frequency. In other words, center frequency $F_{RF}$ is desirably directly downconverted precisely to $F_{BB}$. For wideband modulations, this poses no problem because the same LO signal 65 that performs a direct upconversion in upconverter 62 is available to analog synthesizer 90 for use in generating clock signal 92 for downconverter 88.

But for narrowband modulations, an intermediate IF step is applied, and the same LO signal 65 that drives the final upconversion process in upconverter 62 cannot be used to perform a direct downconversion to baseband without first taking IF oscillation signal 46 ($F_D$) into consideration. In the preferred embodiment, IF oscillation signal 46 ($F_D$) is taken into consideration by coupling a clock input of digital synthesizer 48, which generates IF oscillation signal 46 ($F_D$), to the clock output of analog synthesizer 90. This frequency and phase locks oscillation signal 46 ($F_D$) to clock signal 92 ($F_S$) and to LO signal 65 ($F_{LO}$).

The preferred embodiment contemplates the use of a conventional digital synthesizer for digital synthesizer 48. Thus, digital synthesizer 48 causes oscillation signal 46 ($F_D$) to oscillate at a frequency $F_D$ that is the ratio of two integers times the frequency of its input clock signal. In other words, $F_D=(K/N)\cdot F_S$, where K and N are integer variables supplied by control element 50. Accordingly, for narrowband modulations, $F_D$ is preferably constrained to the set of those values that will lead to as nearly a perfect downconversion to baseband as possible by downconverter 88. In other words:

$$F_D = \left(\frac{K}{N}\right) F_S \quad \text{EQ. 1}$$

$$F_S = \left(\frac{4}{2M \pm 1}\right) F_{LO} \mp \left[\left(\frac{4}{2M \pm 1}\right)\left(\frac{K}{N}\right)\right] F_S \quad \text{EQ. 2}$$

$$\left[1 \pm \left(\frac{4}{2M \pm 1}\right)\left(\frac{K}{N}\right)\right] F_S = \left(\frac{4}{2M \pm 1}\right) F_{LO}; \text{ and} \quad \text{EQ. 3}$$

$$F_S = \left(\frac{4N}{N(2M \pm 1) \pm 4K}\right) F_{LO} \quad \text{EQ. 4}$$

Desirably, for narrowband modulations, the integer variables K, N, and M are selected to satisfy equations EQ. 1 and EQ. 4, presented above. And, as discussed above the integer M is also selected to satisfy the Nyquist criteria for the highest frequency harmonics to be downconverted and is usually an integer greater than 10. For wideband modulations, K is desirably set to zero so that $F_D$ will equal zero, while M is selected to satisfy the Nyquist criteria for the highest frequency harmonics to be downconverted and is usually an integer greater than 10.

LO leakage detector 104 receives IF oscillation signal 46 ($F_D$) in addition to return-data stream 102. Referring to FIGS. 1 and 4, any LO leakage 72 in RF communication signals 66 and 84 is downconverted to a frequency of $-F_D$ in downconverter 88, when RF communication signal 66 is a upper-sideband, as shown in the second trace from the top in FIG. 4 or to a frequency of $+F_D$, when RF communication signal 66 is a lower-sideband, as shown in the third trace from the top in FIG. 4. Accordingly, LO leakage detector 104 includes a conjugation (CONJ) section 106 that receives and conjugates IF oscillation signal 46 ($F_D$) to oppose the polarity of LO leakage 72, now downconverted to baseband. Conjugation section 106 has an output that couples to a first input of a mixer 108, and a second input of mixer 108 receives baseband return-data stream 102. Thus, regardless of an actual frequency for baseband center frequency $F_{BB}$, mixer 108 produces a substantially DC signal of a polarity that opposes LO leakage 72. An output of mixer 108 couples to an input of a low pass filter (LPF) 110, and an output of LPF 110 serves as the output of LO leakage detector 104 and provides combining signal 56 to combiner 54.

Accordingly, a negative feedback loop is provided for the cancellation of LO leakage 72. A DC combining signal 56 is generated by LO leakage detector 104 and added into the communication signal in combiner 54. This combining signal 56 is then upconverted in upconverter 62 to the same frequency as LO leakage 72, but exhibits a phase opposite to LO leakage 72, thereby canceling LO leakage 72. Any residual leakage 72 is downconverted to $\pm F_D$ in downconverter 88, then further downconverted in mixer 108 to a DC signal of a polarity and amplitude that will tend to reduce the residual leakage 72. The response time of the feedback loop is controlled by LPF 110, which is desirably set to exhibit a relatively slow response time. The feedback loop works for both the direct upconversion performed with wideband modulations and the two-stage upconversion performed with narrowband modulations.

In summary, the present invention provides an improved radio frequency (RF) transmitter and method. In at least one embodiment, the present invention provides an RF transmitter that employs an RF module capable of accommodating a variety of both wideband and narrowband communication signals in a variety of frequency bands. In at least one embodiment, the present invention provides an RF transmitter that uses digital processing at a sample rate which accommodates a wideband communication signal and a single analog upconversion stage for both wideband multichannel communication signals and narrowband multichannel communication signals. In at least one embodiment, the present invention provides an RF transmitter that uses cancellation upstream of an analog upconversion stage to cancel local oscillator (LO) leakage components inserted by the analog upconversion stage. In at least one embodiment, the present invention accommodates both wideband and narrowband multichannel communication signals at no appreciable increase in cost, size, or weight when compared to a corresponding RF transmitter that accommodates either only a wideband multichannel communication signal or only a narrowband multichannel communication signal.

Although the preferred embodiments of the invention have been illustrated and described in detail, it will be readily apparent to those skilled in the art that various modifications may be made therein without departing from the spirit of the invention or from the scope of the appended claims. These and other modifications and adaptations which are obvious to those skilled in the art are to be included within the scope of the present invention.

What is claimed is:

1. A radio-frequency (RF) transmitter comprising:
    a digital communication signal source configured to supply a data stream conveying a plurality of channels separated in frequency from one another in said data stream and exhibiting a baseband center frequency ($F_{BB}$) for all of said plurality of channels which is less than a bandwidth that spans all of said plurality of channels;
    a digital mixer coupled to said communication signal source and configured to shift said plurality of channels in frequency so that an intermediate frequency (IF) center frequency ($F_{IF}$) for all of said plurality of channels is greater than said bandwidth that spans all of said plurality of channels;
    a digital-to-analog converter coupled to said digital mixer;
    an analog upconverter coupled to said digital-to-analog (D/A) converter; and
    a power amplifier coupled to said analog upconverter.

2. An RF transmitter as claimed in claim 1 additionally comprising:
    a control element coupled to said digital mixer, said control element being configured to selectably enable said shift of said plurality of channels in frequency and to selectably disable said shift of said plurality of channels in frequency.

3. An RF transmitter as claimed in claim 2 wherein:
    said signal source is configured to supply said data stream in a wideband modulation form and in a narrowband modulation form;
    said control element is configured to shift said plurality of channels in frequency when said plurality of channels is modulated in accordance with a narrowband modulation; and
    said control element is configured to refrain from shifting said plurality of channels in frequency when said plurality of channels is modulated in accordance with a wideband modulation.

4. An RF transmitter as claimed in claim 1 wherein:
    said power amplifier generates an RF communication signal having a center frequency ($F_{RF}$);
    said transmitter additionally comprises a subharmonic-sampling downconverter adapted to receive a portion of said RF communication signal, said subharmonic-sampling downconverter sampling said portion of said RF communication signal at a sampling rate of $F_s$, where $F_S = 4F_{RF}/(2M\pm1)$ and where M is an integer; and
    said digital mixer processes said data stream at a data rate synchronized with said sampling rate $F_s$.

5. An RF transmitter as claimed in claim 1 wherein:
    said signal source comprises a predistorter adapted to receive said data stream in a raw form, to predistort said data stream into a predistorted data stream, and to pass said predistorted data stream to said digital mixer;
    said transmitter additionally comprises an error signal generator having an output coupled to said predistorter, a first input adapted to receive said data stream in said raw form, and a second input;
    said power amplifier generates an RF communication signal; and said transmitter additionally comprises a subharmonic-sampling downconverter adapted to receive a portion of said RF communication signal and generate a return-data stream, said return-data stream being passed to said second input of said error signal generator.

6. An RF transmitter as claimed in claim 1 wherein:
said power amplifier generates an RF communication signal having a transmission center frequency ($F_{RF}$); and
said transmitter additionally comprises a subharmonic-sampling downconverter adapted to receive a portion of said RF communication signal and to produce from said portion of said RF communication signal a return baseband signal having a center frequency equal to said baseband center frequency ($F_{BB}$).

7. An RF transmitter as claimed in claim 6 wherein:
said subharmonic-sampling downconverter is configured to sample said portion of said RF communication signal at a sampling rate of $F_s$, where $F_s=4F_{RF}/(2M\pm1)$ and where M is an integer selected so that said sampling rate $F_s$ is greater than or equal to the Nyquist rate for a third harmonic of a maximum frequency ($F_{BB-MAX}$) exhibited by said plurality of channels when said center frequency for said plurality of channels equals said baseband center frequency ($F_{BB}$).

8. An RF transmitter as claimed in claim 7 wherein said integer M is selected so that said sampling rate $F_s$ is at least equal to the Nyquist rate for a fifth harmonic of said maximum frequency ($F_{BB-MAX}$) exhibited by said plurality of channels when said center frequency for said plurality of channels equals said baseband center frequency ($F_{BB}$).

9. An RF transmitter as claimed in claim 7 additionally comprising:
an oscillator configured to generate a first oscillating signal which oscillates substantially at said sampling rate $F_s$; and
a digital synthesizer having an input adapted to receive said first oscillating signal and an output coupled to said digital mixer.

10. An RF transmitter as claimed in claim 9 wherein:
said digital synthesizer is configured to generate a second oscillating signal which oscillates at a rate ($F_D$) substantially equal to a difference between said IF center frequency ($F_{IF}$) and said baseband center frequency ($F_{BB}$) and also substantially equal to a ratio of two integers times said sampling rate ($F_s$).

11. An RF transmitter as claimed in claim 6 wherein:
said transmitter additionally comprises an oscillator coupled to said analog upconverter and configured to generate a first oscillating signal oscillating at a frequency ($F_{LO}$) related to said transmission center frequency ($F_{RF}$) and said IF center frequency ($F_{IF}$) such that $F_{RF}=F_{LO}\pm F_{IF}$;
said transmitter additionally comprises a second oscillator coupled to said digital mixer and configured to generate a second oscillating signal which oscillates at a frequency ($F_D$) substantially equal to a difference between said IF center frequency ($F_{IF}$) and said baseband center frequency ($F_{BB}$);
said subharmonic-sampling downconverter samples said portion of said RF communication signal at a sampling frequency ($F_s$) related to said first oscillating signal substantially as follows: $F_s=\{4N/[N(2M\pm1)\pm4K]\}F_{LO}$, where M, K, and N are integers; and
said second oscillator is configured to generate said second oscillating signal so as to be related to said sampling frequency $F_s$ substantially as follows: $F_D=(K/N)F_s$.

12. An RF transmitter as claimed in claim 1 wherein:
said power amplifier generates an RF communication signal having an RF center frequency ($F_{RF}$);
said RF center frequency ($F_{RF}$) resides at any of a plurality of frequencies within a licensed frequency band having an upper-half licensed sub-band and a lower-half licensed sub-band; and
said transmitter additionally comprises an oscillator coupled to said analog upconverter, said oscillator being configured so that said RF communication signal is an upper-sideband when said RF center frequency ($F_{RF}$) resides in said lower-half licensed sub-band and so that said RF communication signal is a lower-sideband when said RF center frequency ($F_{RF}$) resides in said upper-half licensed sub-band.

13. An RF transmitter as claimed in claim 12 wherein:
said analog upconverter generates an RF signal having at least one of said upper- and lower-sidebands;
one of said upper- and lower-sidebands resides inside said licensed frequency band and one of said upper- and lower-sidebands resides outside said licensed frequency band; and
said transmitter additionally comprises a bandpass filter coupled between said analog upconverter and said power amplifier, said bandpass filter being configured to attenuate one of said upper- and lower-sidebands which resides outside said licensed frequency band.

14. An RF transmitter as claimed in claim 13 wherein:
said bandpass filter is one of a plurality of bandpass filters coupled between said analog upconverter and said power amplifier; and
said plurality of bandpass filters has different passbands so that said RF transmitter can form said RF communication signal to reside in any of a plurality of licensed frequency bands.

15. An RF transmitter as claimed in claim 1 wherein said digital communication signal source comprises:
a digital upconversion section having an input port adapted to receive individual communication signals and being configured to modulate said individual communication signals onto said plurality of channels separated in frequency from one another and to combine said plurality of channels in said data stream.

16. An RF transmitter as claimed in claim 1 wherein said power amplifier generates an RF communication signal having a local oscillator (LO) leakage component therein, and said transmitter additionally comprises:
a downconverter adapted to receive a portion of said RF communication signal and to produce from said portion of said RF communication signal a return baseband signal having a center frequency substantially equal to said baseband center frequency ($F_{BB}$);
a combiner coupled to said digital mixer; and
an LO leakage detector coupled to said downconverter and to said combiner, said LO leakage detector being configured to generate a signal which, when combined with said plurality of channels in said combiner, at least partially cancels said local oscillator (LO) leakage component.

17. An RF transmitter as claimed in claim 16 wherein:
said RF transmitter additionally comprises an oscillator that generates a signal having a frequency substantially equal to a frequency of said local oscillator (LO) leakage component in said return baseband signal; and said LO leakage detector comprises a mixer having one input adapted to receive said return baseband signal, another input coupled to said oscillator, and an output coupled to said combiner.

18. A radio-frequency (RF) transmitter comprising:
a communication signal source configured to supply a communication signal modulated with user-supplied data;
an upconverter coupled to said communication signal source and configured to generate an RF form of said communication signal, said RF form of said communication signal having a local oscillator (LO) leakage component therein;
a combiner coupled to said upconverter;
a power amplifier adapted to amplify said RF form of said communication signal for broadcast from said RF transmitter;
a downconverter adapted to receive a portion of said RF form of said communication signal and to produce a return baseband signal from said portion; and
an LO leakage detector coupled to said downconverter and to said combiner, said LO leakage detector being configured to generate a combining signal in response to said RF form of said communication signal which, when combined with said communication signal in said combiner, at least partially cancels said LO leakage component.

19. An RF transmitter as claimed in claim 18 wherein said downconverter is a subharmonic-sampling downconverter.

20. An RF transmitter as claimed in claim 18 wherein said RF transmitter additionally comprises:
a mixer coupled between said communication signal source and said upconverter and configured to generate an intermediate frequency (IF) form of said communication signal; and
an IF oscillator configured to generate an IF oscillation signal, said IF oscillator being coupled to said mixer and to said LO leakage detector so that said combining signal is responsive to said IF oscillation signal.

21. An RF transmitter as claimed in claim 20 wherein said combiner is coupled between said mixer and said upconverter.

22. An RF transmitter as claimed in claim 20 wherein said mixer is a first mixer and said LO leakage detector comprises:
a second mixer having inputs coupled to said downconverter and to said IF oscillator and having an output; and
a low pass filter having an input coupled to said output of said second mixer and having an output coupled to said combiner.

23. An RF transmitter as claimed in claim 18 wherein:
said combiner is a digital combiner having an input coupled to said communication signal source and having an output; and
said RF transmitter additionally comprises a digital-to-analog (D/A) converter having an input coupled to said output and having an output coupled to said upconverter.

24. An RF transmitter as claimed in claim 18 wherein:
said upconverter is an analog upconverter;
said communication signal source is configured so that said communication signal is a digital data stream that conveys a plurality of channels separated in frequency from one another, with a baseband center frequency ($F_{BB}$) for all of said plurality of channels being less than a bandwidth that spans all of said plurality of channels;
said RF transmitter additionally comprises a digital mixer coupled to said communication signal source and configured to shift said plurality of channels in frequency so that an intermediate frequency (IF) center frequency ($F_{IF}$) for all of said plurality of channels is greater than said bandwidth that spans all of said plurality of channels;
said combiner couples to said digital mixer; and
said RF transmitter additionally comprises a digital-to-analog converter coupled between said combiner and said analog upconverter.

25. An RF transmitter as claimed in claim 24 wherein said RF transmitter additionally comprising:
a control element coupled to said digital mixer, said control element being configured to selectably enable said shift of said plurality of channels in frequency and to selectably disable said shift of said plurality of channels in frequency.

26. An RF transmitter as claimed in claim 25 wherein:
said communication signal source is configured to supply said data stream in a wideband modulation form and in a narrowband modulation form;
said control element is configured to shift said plurality of channels in frequency when said plurality of channels are modulated in accordance with a narrowband modulation; and
said control element is configured to refrain from shifting said plurality of channels in frequency when said plurality of channels are modulated in accordance with a wideband modulation.

27. An RF transmitter as claimed in claim 24 wherein:
said RF form of said communication signal has a transmission center frequency ($F_{RF}$); and
said downconverter is a subharmonic-sampling downconverter adapted so that said return baseband signal has a center frequency equal to said baseband center frequency ($F_{BB}$).

28. A method of operating a radio-frequency (RF) transmitter comprising:
determining, in a control element, whether or not said RF transmitter will transmit a narrowband communication signal;
providing, from a digital upconversion section, a baseband digital data stream which conveys a plurality of channels separated in frequency from one another and which exhibits a baseband center frequency ($F_{BB}$) for all of said plurality of channels that is less than a bandwidth that spans all of said plurality of channels;
when said determining step determines that said RF transmitter will transmit said narrowband communication signal:
digitally shifting, in a mixer, said plurality of channels in frequency to produce an intermediate frequency (IF) digital data stream for which an IF center frequency ($F_{IF}$) is greater than said bandwidth that spans all of said plurality of channels;
converting, in a digital-to-analog converter, said IF digital data stream into an analog IF communication signal; and
upconverting, in an upconverter, said analog IF communication signal to a radio-frequency (RF) communication signal having an RF center frequency ($F_{RF}$).

29. A method as claimed in claim 28 additionally comprising downconverting a portion of said RF communication signal by subharmonic sampling at a sampling rate ($F_s$) configured to produce a return baseband signal having a center frequency equal to said baseband center frequency ($F_{BB}$).

30. A method as claimed in claim 29 wherein said sampling rate ($F_s$) is further configured to be greater than or equal to the Nyquist rate for a third harmonic of a maximum frequency ($F_{BB-MAX}$) exhibited by said plurality of channels when said center frequency for said plurality of channels equals said baseband center frequency ($F_{BB}$).

31. A method as claimed in claim 29 wherein said sampling rate ($F_s$) is further configured to be greater than or equal to the Nyquist rate for a fifth harmonic of a maximum frequency ($F_{BB-MAX}$) exhibited by said plurality of channels when said center frequency for said plurality of channels equals said baseband center frequency ($F_{BB}$).

32. A method as claimed in claim 29 additionally comprising:
synthesizing an oscillating signal for use in said digitally shifting step, said oscillating signal being configured to oscillate at a frequency ($F_D$) substantially equal to a difference between said TE center frequency ($F_{IF}$) and said baseband center frequency ($F_{BB}$) and also substantially equal to a ratio of two integers times said sampling rate ($F_s$).

33. A method as claimed in claim 28 wherein:
said RF center frequency ($F_{RF}$) resides at any of a plurality of frequencies within a licensed frequency band having an upper-half licensed sub-band and a lower-half licensed sub-band; and
said converting step is configured so that said RF communication signal is an upper-sideband when said RF center frequency ($F_{RF}$) resides in said lower-half licensed sub-band and so that said RF communication signal is a lower-sideband when said RF center frequency ($F_{RF}$) resides in said upper-half licensed sub-band.

34. A method as claimed in claim 28 wherein said providing step comprises:
digitally upconverting individual communication signals to modulate said individual communication signals into said plurality of channels separated in frequency from one another; and
combining said plurality of channels in said baseband digital data stream.

35. A method as claimed in claim 28 wherein said upconverting step inserts a local oscillator (LO) leakage component into said RF communication signal, and said method additionally comprises:
downconverting a portion of said RF communication signal to produce a return baseband signal;
generating a combining signal in response to said return baseband signal, said combining signal being configured so that when combined with said plurality of channels, said combining signal at least partially cancels said local LO leakage component; and
combining said combining signal with said IF digital data stream.

* * * * *

UNITED STATES PATENT AND TRADEMARK OFFICE
CERTIFICATE OF CORRECTION

PATENT NO. : 7,542,519 B2 Page 1 of 1
APPLICATION NO. : 11/323686
DATED : June 2, 2009
INVENTOR(S) : Ronald Duane McCallister It is certified that error appears in the above-identified patent and that said Letters Patent is hereby corrected as shown below:

Col 21, Line 15, please delete "TE" and insert --IF-- therefor.

Signed and Sealed this

Twenty-ninth Day of June, 2010

David J. Kappos
*Director of the United States Patent and Trademark Office*